(12) United States Patent
Chen et al.

(10) Patent No.: US 11,322,348 B2
(45) Date of Patent: May 3, 2022

(54) MULTI-FUNCTION EQUIPMENT IMPLEMENTING FABRICATION OF HIGH-K DIELECTRIC LAYER

(71) Applicant: Miin-Jang Chen, Taipei (TW)

(72) Inventors: Miin-Jang Chen, Taipei (TW); Chen-Yang Chung, Taipei (TW)

(73) Assignee: Miin-Jang Chen, Taipei (TW)

( * ) Notice: Subject to any disclaimer, the term of this patent is extended or adjusted under 35 U.S.C. 154(b) by 0 days.

(21) Appl. No.: 17/141,935

(22) Filed: Jan. 5, 2021

(65) Prior Publication Data
US 2021/0134587 A1 May 6, 2021

Related U.S. Application Data

(62) Division of application No. 16/131,249, filed on Sep. 14, 2018, now Pat. No. 10,923,343.

(30) Foreign Application Priority Data

Sep. 15, 2017 (TW) .................................. 106131698

(51) Int. Cl.
*H01L 21/02* (2006.01)
*H01J 37/32* (2006.01)
(Continued)

(52) U.S. Cl.
CPC ........ *H01L 21/0234* (2013.01); *C23C 16/405* (2013.01); *C23C 16/45538* (2013.01); *C23C 16/45542* (2013.01); *C23C 16/45544* (2013.01); *C23C 16/503* (2013.01); *C23C 16/56* (2013.01); *H01J 37/3244* (2013.01); *H01J 37/32568* (2013.01); *H01J 37/32715* (2013.01); *H01J 37/32816* (2013.01); *H01L 21/0228* (2013.01);
(Continued)

(58) Field of Classification Search
CPC .......... H01L 21/0234; H01L 21/02164; H01L 21/02178; H01L 21/02181; H01L 21/02186; H01L 21/02189; H01L 21/02192; H01L 21/02274; H01L 21/0228; H01L 21/28194; H01L 29/513; H01L 29/517; H01J 37/3244; H01J 37/32568; H01J 37/32816; H01J 37/32009; H01J 2237/332; C23C 16/405; C23C 16/45538; C23C 16/45542; C23C 16/45544; C23C 16/503; C23C 16/56
USPC ........................................................ 257/632
See application file for complete search history.

(56) References Cited

U.S. PATENT DOCUMENTS

2003/0213987 A1 11/2003 Basceri
2004/0048461 A1* 3/2004 Chen ................ H01L 21/76871
438/653

(Continued)

*Primary Examiner* — Dao H Nguyen
(74) *Attorney, Agent, or Firm* — Muncy, Geissler, Olds & Lowe, P.C.

(57) ABSTRACT

A multi-function equipment implements a method of fabricating a thin film. The multi-function equipment according to the invention includes a reaction chamber, a plasma source, a plasma source power generating unit, a bias electrode, an AC (Alternating Current) voltage generating unit, a DC (Direct current) bias generating unit, a metal chuck, a first precursor supply source, a second precursor supply source, a carrier gas supply source, an oxygen supply source, a nitrogen supply source, an inert gas supply source, an automatic pressure controller, and a vacuum pump.

2 Claims, 6 Drawing Sheets

(51) Int. Cl.
    *C23C 16/455* (2006.01)
    *C23C 16/56* (2006.01)
    *H01L 29/51* (2006.01)
    *C23C 16/503* (2006.01)
    *C23C 16/40* (2006.01)

(52) U.S. Cl.
    CPC .. *H01L 21/02164* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02274* (2013.01); *H01L 29/513* (2013.01); *H01L 29/517* (2013.01); *H01J 37/32009* (2013.01); *H01J 2237/332* (2013.01)

(56) References Cited

U.S. PATENT DOCUMENTS

| | | | |
|---|---|---|---|
| 2004/0224504 A1* | 11/2004 | Gadgil | C23C 16/045 438/680 |
| 2005/0260354 A1* | 11/2005 | Singh | H01J 37/32495 427/523 |
| 2006/0019033 A1 | 1/2006 | Muthukrishnan | |
| 2006/0153995 A1 | 7/2006 | Narwankar | |
| 2006/0281330 A1 | 12/2006 | Ahn | |
| 2008/0054332 A1 | 3/2008 | Kim | |
| 2010/0075507 A1 | 3/2010 | Chang | |
| 2011/0241042 A1 | 10/2011 | Chen | |
| 2012/0074533 A1 | 3/2012 | Aoyama | |
| 2012/0199935 A1 | 8/2012 | Chen | |
| 2014/0299577 A1* | 10/2014 | Chung | C23C 16/44 118/712 |
| 2015/0279681 A1 | 10/2015 | Knoops | |
| 2018/0076028 A1* | 3/2018 | Swaminathan | H01L 21/02164 |
| 2020/0111645 A1* | 4/2020 | Koshiishi | H01J 37/32834 |
| 2021/0143032 A1* | 5/2021 | Paeng | H01J 37/32715 |

* cited by examiner

MULTI-FUNCTION EQUIPMENT IMPLEMENTING FABRICATION OF HIGH-K DIELECTRIC LAYER

CROSS-REFERENCE TO RELATED APPLICATION

This application is a divisional of co-pending application Ser. No. 16/131,249, filed on Sep. 14, 2018, for which priority is claimed under 35 U.S.C. § 120; and this application claims priority of application Ser. No. 106131698 filed in Taiwan on Sep. 15, 2017 under 35 U.S.C. § 119, the entire contents of all of which are hereby incorporated by reference.

BACKGROUND OF THE INVENTION

1. Field of the Invention

The invention relates to a high-k dielectric layer, a fabricating method thereof and a multi-function equipment implementing such fabricating method. And more particularly, the invention relates to a high-k dielectric layer having low leakage current density, a fabricating method thereof and a multi-function equipment implementing such fabricating method.

2. Description of the Prior Art

In order to meet the requirements of reducing sizes and gate leakage currents of semiconductor devices, many gate dielectric materials having high dielectric constant have been proposed to replace the conventional dielectric layer. Taking silicon-based semiconductor devices as an example, $Al_2O_3$, $HfO_2$, $ZrO_2$, $TiO_2$, $Y_2O_3$, and $La_2O_3$ and so on have been proposed to replace the conventional $SiO_2$ gate dielectric layer.

However, the film quality and defect density of the dielectric layer have a great influence on the gate leakage current. At present, there is still considerable room for the process of manufacturing a dielectric layer having excellent film quality and low defect density, as well as in-process treatment or post-process treatment.

SUMMARY OF THE INVENTION

Accordingly, one scope of the invention is to provide a high-k dielectric layer which has excellent film quality and low defect density and thus has low leakage current density, a fabricating method thereof, and a multi-function equipment implementing such method. Moreover, the high-k dielectric layer according to the invention has excellent reliability.

A high-k dielectric layer according to a preferred embodiment of the invention is formed in a semiconductor device. The high-k dielectric layer according to the invention includes M atomic-layer-deposited films where M is an integer larger than 1. The M atomic-layer-deposited films are formed in sequence on a material layer of the semiconductor device. The material layer can be a semiconductor layer, a metal layer or another dielectric layer. Each atomic-layer-deposited film is formed of an oxide and formed by an atomic layer deposition (ALD) process. During fabrication of the M atomic-layer-deposited films, N assigned films among the M atomic-layer-deposited films are bombarded by a non-reactive gas plasma during or after cycles of the ALD process to result in an annealing effect such that a defect density of the N assigned films is reduced, where N is a natural number and less than or equal to M.

In one embodiment, the high-k dielectric layer according to the invention has a leakage current density less than $1 \times 10^{-4}$ $A/cm^2$ when a capacitance equivalent thickness (CET) of the high-k dielectric layer is less than 2 nm. Moreover, the high-k dielectric layer according to the invention has a thickness ranging from 1 nm to 50 nm.

A method of fabricating a high-k dielectric layer in a semiconductor device according to a preferred embodiment of the invention, firstly, is to form M atomic-layer-deposited films of an oxide in sequence on a material layer of the semiconductor device by an ALD process, where M is an integer larger than 1. The material layer can be a semiconductor layer, a metal layer or another dielectric layer. During fabrication of the M atomic-layer-deposited films, the method according to invention is, for N assigned films among the M atomic-layer-deposited films, to bombard the N assigned films by a non-reactive gas plasma during or after cycles of the ALD process to finish the high-k dielectric layer, and to result in an annealing effect such that a defect density of the N assigned films is reduced, where N is a natural number and less than or equal to M.

In one embodiment, the oxide can be $HfO_2$, $ZrO_2$, $Al_2O_3$, $La_2O_3$, $SiO_2$, $TiO_2$, $Y_2O_3$, etc.

In one embodiment, an inert gas used to generate the non-reactive gas plasmas can be Ar, He, Ne, He/Ar, $He/N_2$, He/Ne, etc.

A multi-function equipment according to a preferred embodiment of the invention implements the method of fabricating a high-k dielectric layer in a semiconductor device. The multi-function equipment according to the invention includes a reaction chamber, a plasma source, a plasma source power generating unit, a bias electrode, an AC (Alternating Current) voltage generating unit, a DC (Direct current) bias generating unit, a metal chuck, a first precursor supply source, a second precursor supply source, a carrier gas supply source, an oxygen supply source, an inert gas supply source, an automatic pressure controller, and an vacuum pump. The plasma source is disposed in the reaction chamber and at a top of the reaction chamber. The plasma source power generating unit is electrically connected to the plasma source, and is controlled to output an AC power to the plasma source. The bias electrode is disposed in the reaction chamber and at a bottom of the reaction chamber. The AC voltage generating unit is electrically connected to the bias electrode, and is controlled to selectively output an AC voltage or the AC voltage combined with a DC bias to the bias electrode to control an energy of bombardment by a non-reactive gas plasma. The DC bias generating unit is electrically connected to the bias electrode, and is controlled to selectively output a positive DC bias or a negative DC bias to the bias electrode to control the energy of bombardment by the non-reactive gas plasma. The metal chuck is disposed on the bias electrode, and holds a semi-product of the semiconductor device. The first precursor supply source is connected with the reaction chamber via a first control valve, and is controlled to supply a first precursor of an oxide to the reaction chamber. The second precursor supply source is connected with the reaction chamber via a second control valve, and is controlled to supply a second precursor of the oxide to the reaction chamber. The carrier gas supply source is connected with the reaction chamber via a first flow controller, and is controlled to supply a carrier gas to the reaction chamber. The oxygen supply source is connected with the top of the reaction chamber via a second flow controller, and is controlled to supply an oxygen gas, the oxygen gas being ionized by the AC power of the plasma source into an oxygen plasma. The inert gas supply source is connected with the top of the reaction chamber via a third flow controller, and is controlled to supply an inert gas, the inert gas being ionized by the AC power of the plasma source into a non-reactive gas plasma. The vacuum pump is connected with the bottom of the reaction chamber via the automatic pressure controller, and automatically controls a pumping rate via the automatic pressure controller to achieve an ideal process pressure.

Distinguishable from the prior art, the high-k dielectric layer of the invention has excellent film quality and low defect density, and has low leakage current density.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
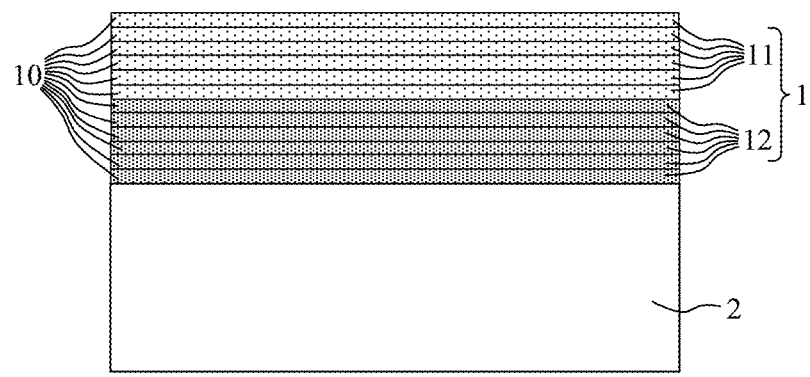
FIG. 1 is a cross-sectional view of a high-k dielectric layer according to a preferred embodiment of the invention.
Figure 2:
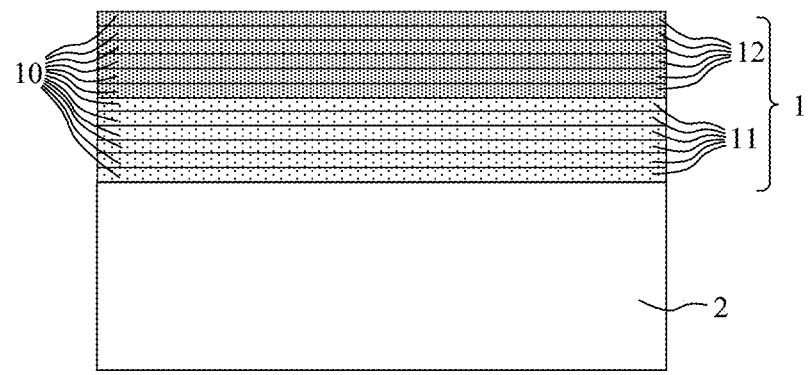
FIG. 2 is a cross-sectional view of a modification of the high-k dielectric layer according to the preferred embodiment of the invention.
Figure 3:
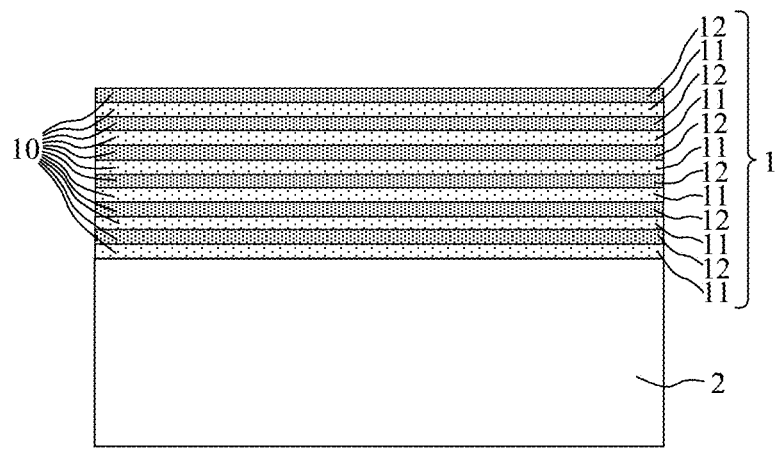
FIG. 3 is a cross-sectional view of another modification of the high-k dielectric layer according to the preferred embodiment of the invention.

Please refer to FIG. 1, FIG. 2 and FIG. 3, these drawings schematically illustrate, in cross-sectional views, a high-k dielectric layer 1 in accordance with a preferred embodiment of the invention.

As shown in FIG. 1, FIG. 2 and FIG. 3, the high-k dielectric layer according to the preferred embodiment of the invention is formed in a semiconductor device 2. The high-k dielectric layer 1 according to the invention is formed on a material layer of the semiconductor device 2. The material layer can be a semiconductor layer, a metal layer or another dielectric layer.

In one embodiment, the semiconductor layer can be formed of Si, Ge, SiGe, GeSn, silicon on insulator, germanium on insulator, group III-V compound, group II-VI compound, and group IV-VI compound. The metal layer can be formed of platinum, rhodium, titanium, tungsten, copper, aluminum, Al—Si—Cu alloy, Al—Cu alloy, titanium nitride, tantalum nitride, heavily doped polysilicon and so on.

Also as shown in FIG. 1, FIG. 2 and FIG. 3, the high-k dielectric layer 1 according to the preferred embodiment of the invention includes M atomic-layer-deposited films 10 where M is an integer larger than 1. The M atomic-layer-deposited films 10 are formed in sequence on the material layer of the semiconductor device 2. The material layer can be a semiconductor layer, a metal layer or another dielectric layer. Each atomic-layer-deposited film 10 is formed of an oxide and formed by an ALD process.

The ALD process adopted by the invention has the following advantages: (1) having the capability to control the formation of the material in nano-metric scale; (2) having the capability to control the film thickness more precisely; (3) having the capability of large-area production; (4) having excellent uniformity; (5) having excellent conformality; (6) having pinhole-free structure; (7) having low defect density; and (8) low deposition temperature, etc. The ALD process adopted by the invention can form the atomic-layer-deposited films 10.

In one embodiment, the oxide can be $HfO_2$, $ZrO_2$, $Al_2O_3$, $La_2O_3$, $SiO_2$, $TiO_2$, $Y_2O_3$, etc.

In particular, during fabrication of the M atomic-layer-deposited films 10, N assigned films 12 among the M atomic-layer-deposited films 10 are bombarded by a non-reactive gas plasma during or after cycles of the ALD process to result in an annealing effect such that a defect density of the N assigned films 12 is reduced, where N is a natural number and less than or equal to M. In FIG. 1, the symbol "11" represents an oxide film formed by only an ALD process without the bombardment by a non-reactive gas plasma. The symbol "12" represents an oxide film formed with the bombardment by the non-reactive gas plasma during or after cycles of the ALD process.

In the example shown in FIG. 1, the number of layers of the N assigned films 12 is half of the number of layers of all the film 10, and the N assigned films 12 are concentrated in the lower half of the high-k dielectric layer 1 of the invention.

In the example shown in FIG. 2, the number of layers of the N assigned films 12 is half of the number of layers of all the film 10, and the N assigned films 12 are concentrated in the upper half of the high-k dielectric layer 1 of the invention.

In the example shown in FIG. 3, the assigned films 12 is intercalated with the atomic-layer-deposited films 11, which has not been bombarded by a non-reactive gas plasma, to form the high-k dielectric layer 1 of the invention. However, the high-k dielectric layer 1 of the invention is not limited to the arrangement relationship between the atomic-layer-deposited films 11 without bombardment by a non-reactive gas plasma and the assigned films 12 with bombardment by the non-reactive gas plasma as shown in FIGS. 1, 2 and 3. The high-k dielectric layer 1 of the invention can also firstly form a plurality of atomic-layer-deposited films 11 without bombardment by a non-reactive gas plasma, and then from an assigned film 12 with bombardment by the non-reactive gas plasma.

In one embodiment, an inert gas used to generate the non-reactive gas plasmas can be Ar, He, Ne, He/Ar, $He/N_2$, He/Ne, etc.

Generally, in the plasma process, Ar is widely used as a working gas for a plasma source. On the other hand, He is generally used as a buffer gas in a vapor deposition process, which serves as a non-flammable gas to control the working pressure. Compared with the Ar plasma, the He plasma has a higher energy because He has a smaller radius such that He has a higher ionization energy. In addition, since the mass of He is small, the damage caused by He plasma is lower than that caused by Ar plasma. Therefore, the assigned film 12 is bombarded with a non-reactive gas plasma such as He plasma, and the energy is transferred to the surface of the assigned film 12 by plasma bombardment, thereby the energy causes an annealing effect. The increase in the surface temperature of the assigned film 12 enhances the migration of the adatoms adsorbed to the surface of the assigned film 12, which facilitates the improvement of the film quality of the assigned film 12 and reduces the defect density of the assigned film 12. Another effect caused by an increase in temperature of the assigned film 12 facilitates the removal of ligands of precursors adsorbed to the surface of the assigned film 12.

Thereby, the high-k dielectric layer 1 according to the invention has a leakage current density less than $1\times10^4$ A/cm² when a capacitance equivalent thickness (CET) of the high-k dielectric layer 1 according to the invention is less than 2 nm. Moreover, the high-k dielectric layer 1 of the invention is applied to a semiconductor device and has a thickness ranging from 1 nm to 50 nm, and therefore, the high-k dielectric layer 1 of the invention can replace the conventional ultra-thin $SiO_2$ film.

A method of fabricating a high-k dielectric layer 1, as shown in FIGS. 1, 2 and 3, in a semiconductor device 2 according to a preferred embodiment of the invention, firstly, is to form M atomic-layer-deposited films 10 of an oxide in sequence on a material layer of the semiconductor device 2 by an ALD process, where M is an integer larger than 1. The material layer can be a semiconductor layer, a metal layer or another dielectric layer.

During fabrication of the M atomic-layer-deposited films 10, the method according to invention is, for N assigned films 12 among the M atomic-layer-deposited films 10, to bombard the N assigned films 12 by a non-reactive gas plasma during or after cycles of the ALD process to finish the high-k dielectric layer 1, and to result in an annealing effect such that a defect density of the N assigned films 12 is reduced, where N is a natural number and less than or equal to M. The arrangement relationship between the atomic-layer-deposited films 11 without bombardment by a non-reactive gas plasma and the assigned films 12 with bombardment by the non-reactive gas plasma of the high-k dielectric layer 1 according to the invention has been described in detail above, and will not be described in detail herein.

The material used to form the semiconductor layer and the inert gas used to generate the non-reactive gas plasma have been described in detail above, and will not be described herein.

In one embodiment, the oxide is $HfO_2$. The precursor of supplying Hf element can be $HfCl_4$, $HfI_4$, $HfCl_2$ $[N(SiMe_3)_2]_2$, $HfCp_2Me_2$, $HfCp_2Cl_2$, $Hf(CpMe)_2Me_2$, $Hf(CpMe)_2(OMe)Me$, $Hf(CpMe)_2(OiPr)Me$, $Hf(CpMe)_2(mmp)Me$, $Hf(Cp)(NMe_2)_3$, $Hf(CpMe)(NMe_2)_3$, $Hf(Cp_2CMe_2)Me_2$, $Hf(Cp_2CMe_2)Me(OMe)$, $Hf(OiPr)_4$, $Hf(OtBu)_4$, $Hf(OtBu)_2(mmp)_2$, $Hf(OtBu)(NEtMe)_3$, $Hf(mmp)_4$, $Hf(mp)_4$, $Hf(ONEt_2)_4$, $Hf(NMe_2)_4$, $Hf(NEt_2)_4$, $Hf(NEtMe)_4$, $Hf[N(SiMe_3)_2]_2Cl_2$, $Hf(NO_3)_4$, etc. The precursor of supplying O element can be $O_2$ plasma, $N_2O$ plasma, $O_3$, $H_2O$, $H_2O_2$, etc.

In another embodiment, the oxide is $ZrO_2$. The precursor of supplying Zr element can be $ZrCl_4$, $ZrI_4$, $ZrCp_2Cl_2$, $ZrCp_2Me_2$, $ZrCp_2Me(OMe)$, $ZrCp(NMe_2)_3$, $Zr(CpMe)_2Me_2$, $Zr(CpMe)_2Me(OMe)$, $Zr(CpMe)(NMe_2)_3$, $Zr(CpEt)(NMe_2)_3$, $Zr(Cp_2CMe_2)Me_2$, $Zr(Cp_2CMe_2)Me(OMe)$, $Zr(OiPr)_4$, $Zr(OiPr)_2(dmae)_2$, $Zr(OtBu)_4$, $Zr(OtBu)_2(dmae)_2$, $Zr(dmae)_4$, $Zr(thd)_4$, $Zr(NMe_2)_4$, $Zr(NEt_2)_4$, $Zr(NEtMe)_4$, $Zr[N(SiMe_3)_2]_2Cl_2$, $Zr(MeAMD)_4$, etc. The precursor of supplying O element can be $O_2$ plasma, $N_2O$ plasma, $O_3$, $H_2O$, $H_2O_2$, etc.

In another embodiment, the oxide is $Al_2O_3$. The precursor of supplying Al element can be $AlCl_3$, $AlBr_3$, $AlMe_3$, $AlMe_2Cl$, $AlMe_2OiPr$, $AlEt_3$, $Al(OEt)_3$, $Al(OnPr)_3$, $Al(mmp)_3$, $Al(NEt_2)_3$, $Al(NiPr_2)_3$, $Al(iPrAMD)Et_2$, etc. The precursor of supplying O element can be $O_2$ plasma, $N_2O$ plasma, $O_3$, $H_2O$, $H_2O_2$, etc.

In another embodiment, the oxide is $TiO_2$. The precursor of supplying Ti element can be $TiF_4$, $TiCl_4$, $TiI_4$, $Ti(CpMe_5)(OMe)_3$, $Ti(CpMe)(OiPr)_3$, $Ti(OMe)_4$, $Ti(OEt)_4$, $Ti(OiPr)_4$, $Ti(OiPr)_2(dmae)_2$, $Ti(OiPr)_2(thd)_2$, $Ti(trhd)_2(O(CMe_2Et)_2$, $Ti(OBu)_4$, $Ti(NMe_2)_4$, $TiCp_2((iPrN)_2C(NHiPr))$, etc. The precursor of supplying O element can be $O_2$ plasma, $N_2O$ plasma, $O_3$, $H_2O$, $H_2O_2$, etc.

In another embodiment, the oxide is $La_2O_3$. The precursor of supplying La element can be $La(thd)_3$, $La[N(SiMe_3)_2]_3$, $La(iPrAMD)_3$, $La(iPrfAMD)_3$, $La(Cp)_3$, $La(CpEt)_3$, $La(CpiPr)_3$, etc. The precursor of supplying O element can be $O_2$ plasma, $N_2O$ plasma, $O_3$, $H_2O$, $H_2O_2$, etc.

In another embodiment, the oxide is $SiO_2$. The precursor of supplying Si element can be $SiCl_4$, $Si_2Cl_6$, $SiCl_3H$, $SiCl_2H_2$, $SiH_4$, $Si(OMe)_4$, $Si(OEt)_4$, $Si(OEt)_3((CH_2)_3NH_2)$, $Si(OtPe)_3OH$, HMDS, $SiH_2(N(CH_3)_2)_2$, $SiH_2(NHtBu)_2$, $SiH_2(NEt_2)_2$, $SiH(N(CH_3)_2)_3$, $Si(NCO)_4$, $MeOSi(NCO)_3$, etc. The precursor of supplying O element can be $O_2$ plasma, $N_2O$ plasma, $O_3$, $H_2O$, $H_2O_2$, etc.

In another embodiment, the oxide is $Y_2O_3$. The precursor of supplying Y element can be $Y(thd)_3$, $YCp_3$, $Y(CpMe)_3$, $Y(CpEt)_3$, $Y(iPrAMD)_3$, etc. The precursor of supplying O element can be $O_2$ plasma, $N_2O$ plasma, $O_3$, $H_2O$, $H_2O_2$, etc.

In one embodiment, the non-reactive gas plasmas has a flow rate ranging from 1 sccm to 1000 sccm.

In one embodiment, the non-reactive gas plasmas has a working pressure ranging from 100 torr to $10^{-3}$ torr.

Figure 4:
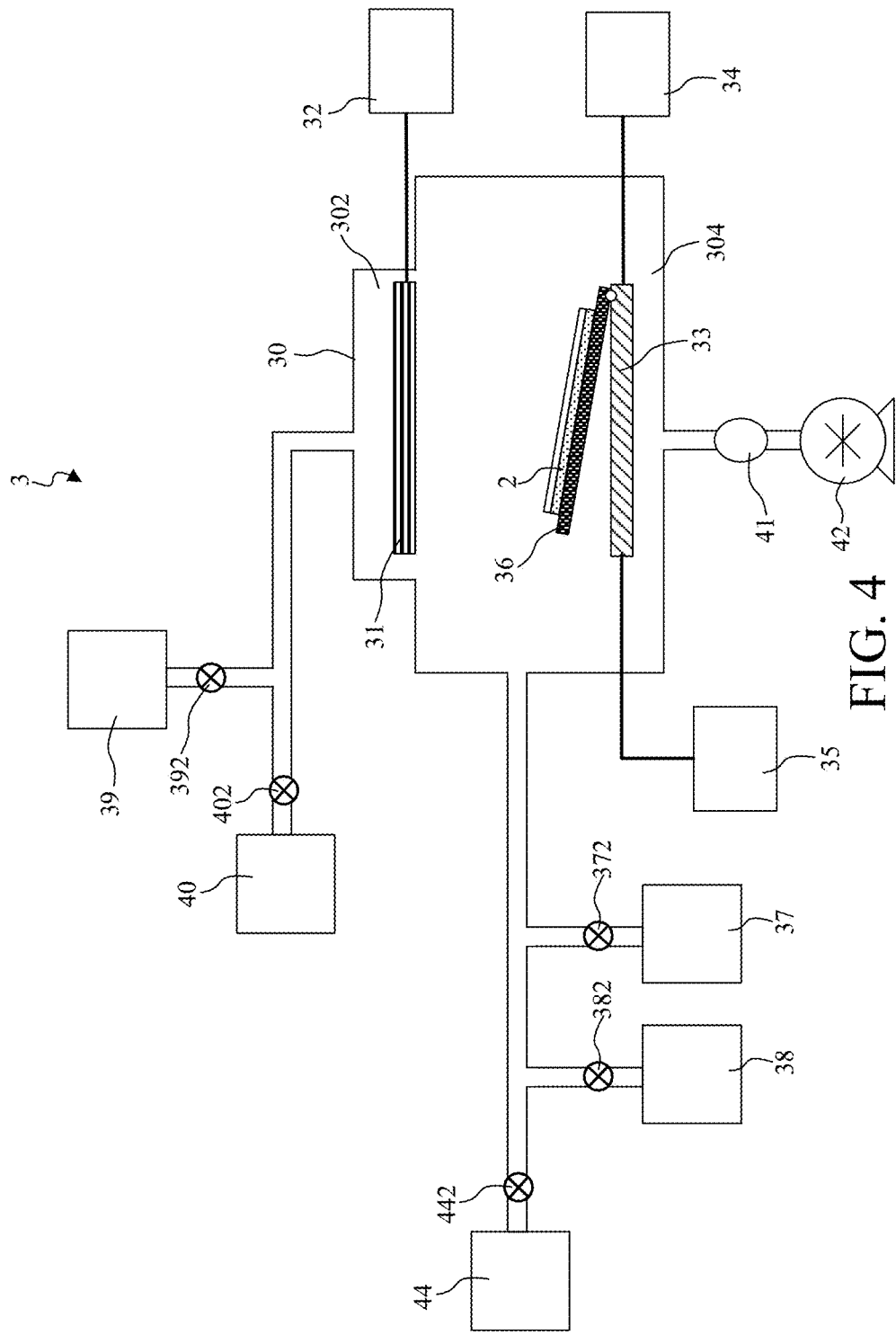
FIG. 4 is a schematic diagram showing the architecture of a multi-function equipment implementing the method according to the invention.

Please refer to FIG. 4, FIG. 4 is a schematic diagram showing the architecture of a multi-function equipment 3 implementing the method according to the invention.

As shown in FIG. 4, the multi-function equipment 3 according to the invention includes a reaction chamber 30, a plasma source 31, a plasma source power generating unit 32, a bias electrode 33, an AC voltage generating unit 34, a DC bias generating unit 35, a metal chuck 36, a first precursor supply source 37, a second precursor supply source 38, a carrier gas supply source 44, an oxygen supply source 39, an inert gas supply source 40, an automatic pressure controller 41, and an vacuum pump 42.

The plasma source 31 is disposed in the reaction chamber 30 and at a top 302 of the reaction chamber 30. The plasma source power generating unit 32 is electrically connected to the plasma source 31, and is controlled to output an AC power to the plasma source 31. The bias electrode 33 is disposed in the reaction chamber 30 and at a bottom 304 of the reaction chamber 30. The AC voltage generating unit 34 is electrically connected to the bias electrode 33, and is controlled to selectively output an AC voltage or the AC voltage combined with a DC bias to the bias electrode 33 to control an energy of bombardment by a non-reactive gas plasma. In one embodiment, the AC voltage generating unit 34 is controlled to selectively output an AC voltage or the AC voltage combined with a DC bias.

The DC bias generating unit 35 is electrically connected to the bias electrode 33, and is controlled to selectively output a positive DC bias or a negative DC bias to the bias electrode 33 to control the energy of bombardment by the non-reactive gas plasma. In one embodiment, the DC bias generating unit 35 is controlled to selectively output a positive DC bias or a negative DC bias.

The metal chuck 36 is disposed on the bias electrode 33, and holds a semi-product of the semiconductor device 2.

The first precursor supply source 37 is connected with the reaction chamber 30 via a first control valve 372, and is controlled to supply a first precursor of an oxide to the reaction chamber 30. The second precursor supply source 38 is connected with the reaction chamber 30 via a second control valve 382, and is controlled to supply a second precursor of the oxide to the reaction chamber 30.

The carrier gas supply source 44 is connected with the reaction chamber 30 via a first flow controller 442, and is controlled to supply a carrier gas to the reaction chamber 30.

The oxygen supply source 39 is connected with the top 302 of the reaction chamber 30 via a second flow controller 392, and is controlled to supply an oxygen gas, the oxygen gas being ionized by the AC power of the plasma source 31 into an oxygen plasma. The inert gas supply source 40 is connected with the top 302 of the reaction chamber 30 via a third flow controller 402, and is controlled to supply an inert gas, the inert gas being ionized by the AC power of the plasma source 31 into a non-reactive gas plasma. The vacuum pump 42 is connected with the bottom 304 of the reaction chamber 30 via the automatic pressure controller 41, and automatically controls a pumping rate via the automatic pressure controller 41 to achieve an ideal process pressure.

It is emphasized that the multi-function equipment 3 according to the invention can perform non-reactive gas plasma bombardment in situ, that is, the multi-function equipment 3 according to the invention can perform a non-reactive gas plasma bombardment in the reaction chamber 30 without the need of moving the semi-product of the semiconductor device 2 to another chamber. Further, during fabrication of the M atomic-layer-deposited films 10, the multi-function equipment 3 according to the invention can perform a non-reactive gas plasma bombardment for N assigned films 12 among the M atomic-layer-deposited films 10 during or after cycles of the ALD process.

Also as shown in FIG. 4, the metal chuck 36 has an adjustable tilt angle relative to the bias electrode 33 to alter the incident angle of the non-reactive gas plasma bombardment of the assigned films 12, and further to control film quality and defect density of the assigned films 12.

Figure 5:
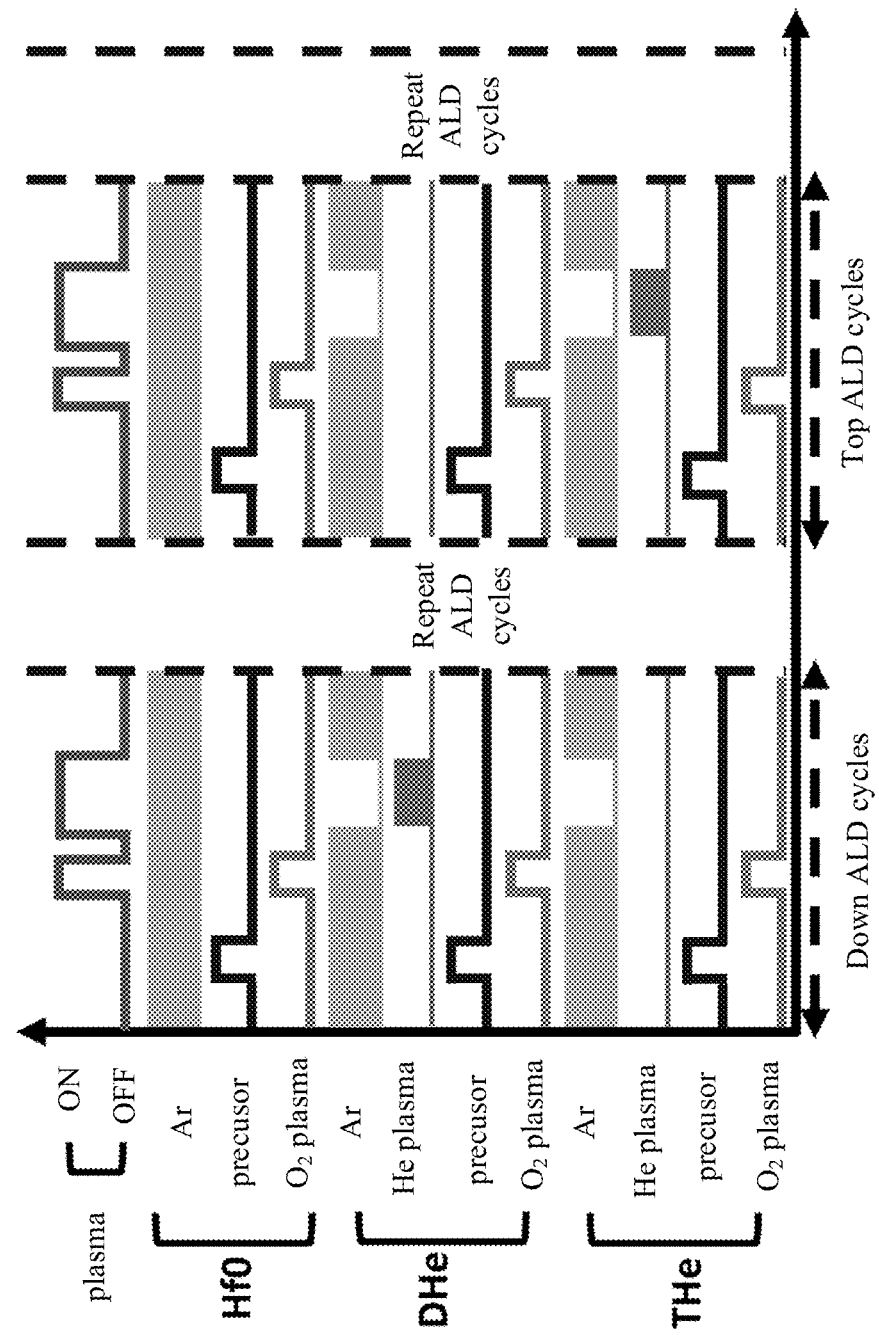
FIG. 5 is a schematic diagram of an ALD cycle process for fabricating a specimen labeled as "DHe", a specimen labeled as "THe", and a specimen labeled as "Hf0" according to the invention.

The invention proves that the high-k dielectric layer of the invention has a low leakage current density. The invention prepares a specimen labeled as "DHe". The specimen DHe consists of a plurality of atomic-layer-deposited films of $HfO_2$ on a p-type silicon substrate having a resistivity of 1-10 Ω-cm, and the lower half of the atomic-layer-deposited films is bombarded by He plasma. The invention also prepares a specimen labeled as "THe". The specimen THe consists of a plurality of atomic-layer-deposited films of $HfO_2$ on a p-type silicon substrate having a resistivity of 1-10 Ω-cm, and the upper half of the atomic-layer-deposited films is bombarded by He plasma. In contrast, the invention also prepares a specimen labeled as "Hf0". The specimen Hf0 consists of a plurality of atomic-layer-deposited films of $HfO_2$ on a p-type silicon substrate having a resistivity of 1-10 Ω-cm, and all of the atomic-layer-deposited films are not bombarded by He plasma. Referring to FIG. 5, FIG. 5 is a schematic diagram of an ALD cycle process for fabricating the specimen DHe, the specimen THe, and the specimen Hf0.

Next, the specimen DHe, the specimen THe and the specimen Hf0 are respectively coated with Pt and Al on the atomic-layer-deposited films of $HfO_2$ and the backside of silicon substrate thereof as gate electrodes and lower electrodes to form metal-oxide-semiconductor structures. Thereafter, the specimen DHe, the specimen THe, and the specimen Hf0 are treated with a post-metallization annealing (PMA) at 400° C. for 30 minutes in an atmosphere of a forming gas of 5% $H_2$ and 95% $N_2$.

Figure 6:
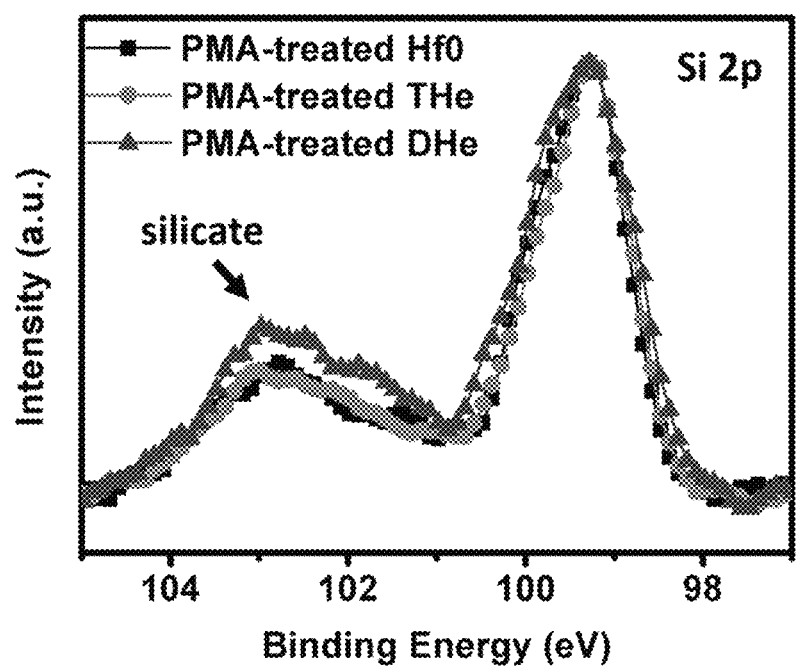
FIG. 6 shows the X-ray photoelectron spectroscopy (XPS) spectra of a PMA-treated specimen DHe, a PMA-treated specimen and a PMA-treated specimen Hf0.
Figure 7:
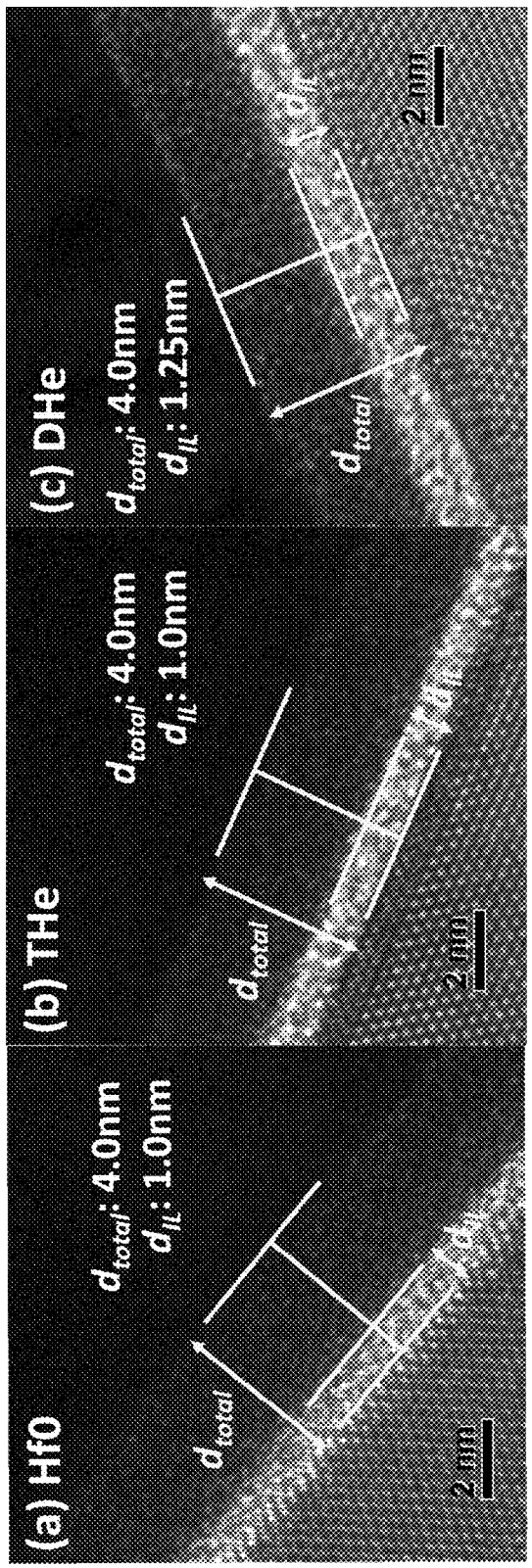
FIG. 7 shows high-resolution transmission electron microscopy (HRTEM) images of the PMA-treated specimen DHe, the PMA-treated specimen and the PMA-treated specimen Hf0.

Please refer to FIG. 6 and FIG. 7. The XPS spectra of the PMA-treated specimen DHe, the PMA-treated specimen THe, and the PMA-treated specimen Hf0 are shown in FIG. 6. HRTEM images of the PMA-treated specimen DHe, the PMA-treated specimen THe, and the PMA-treated specimen Hf0 are shown in FIG. 7. The results shown in FIG. 6 reveal that the PMA-treated specimen DHe has a higher peak intensity of silicate and so has a thicker interfacial layer. The HRTEM images of FIG. 7 also demonstrate that the PMA-treated specimen DHe has a thicker interfacial layer. This is because the He plasma bombardment affects the region adjacent to the silicon substrate during formation of the specimen DHe. In addition, as shown in FIG. 7, the total physical thicknesses of the dielectric layers in the specimen DHe, the specimen THe, and the specimen Hf0 are about 4 nm.

Please refer to Table 1, the capacitance equivalent thicknesses (CET), effective dielectric constants ($K_{eff}$), gate leakage current densities ($J_g$) and interfacial state defect densities ($D_{it}$) of the PMA-treated specimen DHe, the PMA-treated specimen THe, and the PMA-treated specimen Hf0 are listed in Table 1. The gate leakage current density ($J_g$) of the specimen is defined as the flat-band voltage applied to the gate electrode subtracts 1 V. CETs of the PMA-treated specimen DHe, the PMA-treated specimen THe, and the PMA-treated specimen Hf0 are less than 2 nm.

TABLE 1

| with PMA treatment | Hf0 | DHe | THe |
|---|---|---|---|
| CET(nm) | 1.61 | 1.85 | 1.61 |
| $K_{eff}$ | 9.69 | 8.43 | 9.7 |
| $J_g(A/cm^2)$ | $1.67 \times 10^{-4}$ | $1.34 \times 10^{-5}$ | $2.44 \times 10^{-5}$ |
| $D_{it}(cm^{-2}eV^{-1})$ | $7.25 \times 10^{11}$ | $3.46 \times 10^{11}$ | $4.60 \times 10^{11}$ |

The results listed in Table 1 confirm that both the leakage current densities of the PMA-treated specimen DHe and the PMA-treated specimen THe are lower than $1 \times 10^{-4}$ A/cm², which are better than that of the PMA-treated specimen Hf0 not bombarded by He plasma. It is evident that the He plasma bombardment can effectively improve the film quality of the high-k dielectric layer of the invention and reduce the defect density of the high-k dielectric layer of the invention.

Figure 8:
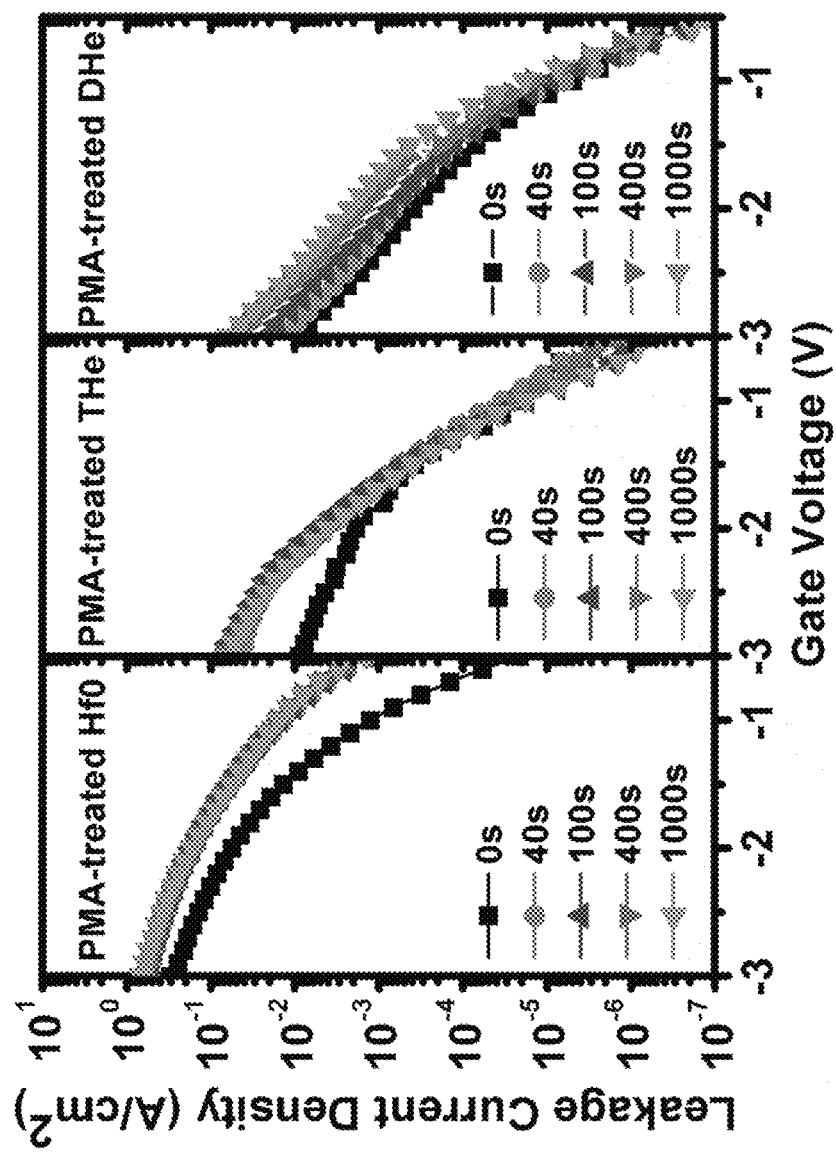
FIG. 8 shows the results of a constant voltage stress test of the PMA-treated specimen DHe, the PMA-treated specimen and the PMA-treated specimen Hf0.

Please refer to FIG. 8. The results of a constant voltage stress test of the PMA-treated specimen DHe, the PMA-treated specimen THe, and the PMA-treated specimen Hf0 are shown in FIG. 8, where the voltage applied to the gate electrode of the specimens is −4 V, and the times of applied voltage are 0, 40, 100, 400, and 1000 sec, respectively. The results shown in FIG. 8 confirm that, compared with the PMA-treated specimen Hf0, when the PMA-treated specimen DHe and the PMA-treated specimen THe are applied at low gate voltages (the absolute values of the gate voltages are less than 2 V), the rising degree of gate leakage current densities of the PMA-treated specimen DHe and the PMA-treated specimen THe is low. It is evident that the specimen DHe and the specimen THe, which are bombarded by He plasma, have better reliability.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A multi-function equipment for fabricating a thin film, said multi-function equipment comprising:
    a reaction chamber;
    a plasma source, disposed in the reaction chamber and at a top of the reaction chamber;
    a plasma source power generating unit, being electrically connected to the plasma source, and being controlled to output an AC power to the plasma source;
    a bias electrode, disposed in the reaction chamber and at a bottom of the reaction chamber;
    an AC voltage generating unit, being electrically connected to the bias electrode, and being controlled to selectively output an AC voltage or the AC voltage combined with a DC bias to the bias electrode to control an energy of bombardment by a non-reactive gas plasma;
    a DC bias generating unit, being electrically connected to the bias electrode, and being controlled to selectively output a positive DC bias or a negative DC bias to the bias electrode to control the energy of bombardment by the non-reactive gas plasma;
    a metal chuck, disposed on the bias electrode, for holding a semi-product of the device;
    a first precursor supply source, connected with the reaction chamber via a first control valve, and being controlled to supply a first precursor of a thin film to the reaction chamber;
    a second precursor supply source, connected with the reaction chamber via a second control valve, and being controlled to supply a second precursor of the thin film to the reaction chamber;
    a carrier gas supply source, connected with the reaction chamber via a first flow controller, and being controlled to supply a carrier gas to the reaction chamber;
    an oxygen supply source, connected with the top of the reaction chamber via a second flow controller, and being controlled to supply an oxygen-containing gas, the oxygen-containing gas being ionized by the AC power of the plasma source into an oxygen plasma;
    a nitrogen supply source, connected with the top of the reaction chamber via a second flow controller, and being controlled to supply a nitrogen-containing gas, the nitrogen-containing gas being ionized by the AC power of the plasma source into a nitrogen plasma; an inert gas supply source, connected with the top of the reaction chamber via a third flow controller, and being controlled to supply an inert gas, the inert gas being ionized by the AC power of the plasma source into a non-reactive gas plasma;
    an automatic pressure controller; and
    a vacuum pump, connected with the bottom of the reaction chamber via the automatic pressure controller, and automatically controlling a pumping rate via the automatic pressure controller to achieve an ideal process pressure;
    wherein said multi-function equipment is used to fabricate the thin film by performing the steps of:
    performing an ALD process to form M atomic-layer-deposited films of the thin film in sequence on the semi-product of the device, wherein M is an integer larger than 1; and
    for N assigned films among the M atomic-layer-deposited films, bombarding the N assigned films by the non-reactive gas plasma during or after cycles of the ALD process to finish the said thin film, and to result in an annealing effect such that a defect density of the N assigned films is reduced, wherein N is a natural number and less than or equal to M.

2. The multi-function equipment of claim 1, wherein the metal chuck has an adjustable tilt angle relative to the bias electrode.

* * * * *